United States Patent [19]

Morrell

[11] 4,271,247

[45] Jun. 2, 1981

[54] COLOR PICTURE TUBE WITH SCREEN HAVING LIGHT ABSORBING AREAS

[75] Inventor: Albert M. Morrell, Lancaster, Pa.

[73] Assignee: RCA Corporation, New York, N.Y.

[21] Appl. No.: 176,250

[22] Filed: Aug. 7, 1980

Related U.S. Application Data

[62] Division of Ser. No. 912, Jan. 2, 1979, abandoned.

[51] Int. Cl.³ .............................................. G03C 5/00
[52] U.S. Cl. ..................................... 430/24; 313/403; 313/408; 313/470; 354/1; 358/65; 358/68; 430/25; 430/26; 430/396
[58] Field of Search .................... 430/24, 25, 26, 396; 313/403, 408, 470; 354/1; 358/65, 68

[56] References Cited

U.S. PATENT DOCUMENTS

| | | | |
|---|---|---|---|
| 3,988,777 | 10/1976 | Hosokoshi et al. | 358/65 |
| 3,993,487 | 11/1976 | Hosokoshi et al. | 430/24 |
| 4,070,498 | 1/1978 | Nishzawa et al. | 430/26 |
| 4,122,461 | 10/1978 | Morean | 430/24 X |
| 4,132,470 | 1/1979 | Van Heek | 354/1 |

*Primary Examiner*—Edward C. Kimlin
*Attorney, Agent, or Firm*—Eugene M. Whitacre; G. H. Bruestle; Dennis H. Irlbeck

[57] ABSTRACT

A tube of the shadow mask type having a line screen and a slit aperture mask wherein the slits are arranged in columns and the slits in each column are separated by web portions of the mask is improved by the addition to the screen of light absorbing material in patches located only in alignment with the webs.

9 Claims, 2 Drawing Figures

COLOR PICTURE TUBE WITH SCREEN HAVING LIGHT ABSORBING AREAS

This is a division of application Ser. No. 000912, filed Jan. 2, 1979, now abandoned.

BACKGROUND OF THE INVENTION

This invention relates to an improved color television picture tube and particularly to a tube having a slit shadow mask and a line screen wherein portions of the screen are covered with a light absorbing material.

Color television picture tubes with screens including light absorbing materials incorporated as a black matrix have been in commercial use for several years. When the matrix screen concept was applied to tubes having slit shadow masks and line screens, the light absorbing areas were disposed as vertical lines between the phosphor lines. One such configuration is shown in U.S. Pat. No. 4,070,596 issued to Tsuneta et al. on Jan. 24, 1978.

There are two types of tubes in general use that have slit shadow masks and line screens. The first has continuous slits extending from the top to the bottom of the mask. In the second type, the slits are shorter apertures aligned in substantially parallel columns. The slits in each column are separated from each other by crossties, i.e., web portions, of the mask. It is this second type of tube which is improved by the present invention.

Three principal methods are used in fabricating screens of most tubes having slit masks with webs. Two of these methods produce continuous phosphor lines across the screen while the third produces phosphor lines, each of which comprises a series of line segments. In one method, a linear light source, aligned with the aperture columns, is used to photoexpose the screen. The length of the linear light source is such that the web pattern is not reproduced on the screen. (See U.S. Pat. No. 4,049,451 issued to H. B. Law, on Sept. 20, 1977.) In the second method, the linear light source is simulated by using a moving point light source. Each of these two methods produce a line screen wherein each line is separated by parallel light absorbing lines. However, in the third method, a stationary point light source is utilized to form the screen, thus producing line segments. In such a method, in addition to the light absorbing areas being disposed as vertical elements between the phosphor lines, the light absorbing areas are connected by additional light absorbing areas behind the crossties which were formed by the shadowing effect of the crossties. Such configuration is shown in U.S. Pat. No. 4,066,924 issued to W. Rublack on Jan. 3, 1978.

In all of the embodiments described in the foregoing mentioned patents, wherein the screens include a light absorbing matrix, the basic mask-screen structure is of a type referred to as negative tolerance in the X—X or horizontal direction. Negative tolerance occurs when the shadow mask apertures define an electron beam spot during tube operation which is larger or wider than a hole in the light absorbing matrix that contains a light emitting phosphor element. In a positive tolerance type matrix structure, the mask aperture defines an electron beam spot during tube operation which is smaller or narrower than the hole in the light absorbing matrix. A tube construction having a matrix line screen with positive tolerance in the X—X or horizontal direction is disclosed in U.S. Pat. No. 3,979,630 issued to D. D. VanOrmer on Sept. 7, 1976.

Each of the foregoing tube types has its peculiar disadvantages. For example, in the prior art matrix tubes, some light output must be sacrificed in order to obtain the desired enhanced contrast. In negative tolerance tubes, the light absorbing matrix covers about 40 percent of the screen area, thus providing a matrix transmission of about 60 percent. Matrix transmission is considerably increased in the positive tolerance matrix tube disclosed in U.S. Pat. No. 3,979,630. The highest matrix transmission noted for a positive tolerance matrix line tube in this patent is 88.6 percent. However, because of the positive tolerance aspect, the mask transmission is considerably less than the mask transmission in a negative tolerance tube thereby resulting in little difference in light output. In both types of prior art tubes, utilization of a light absorbing matrix permits an increase in glass transmission of the tube faceplate which allows substantial recovery of light output lost because of the matrix.

SUMMARY OF THE INVENTION

The present invention provides an improvement in a color picture tube of the shadow mask type having a line screen and a slit aperture mask wherein the slits are arranged in columns and the slits in each column are separated by web portions of the mask. The screen includes the improvement of light absorbing areas consisting of patches disposed in alignment with the web portions.

DETAILED DESCRIPTION

Figure 1:
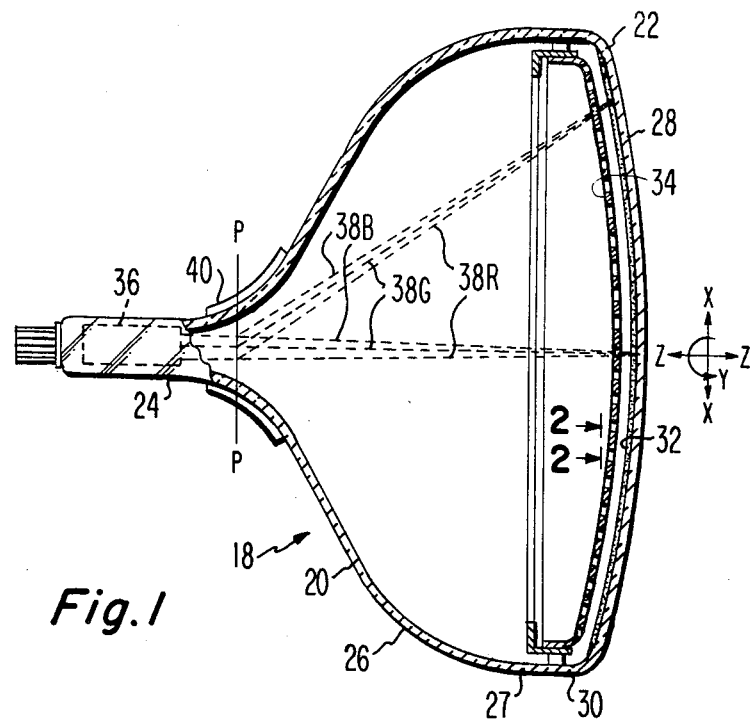
FIG. 1 is a plan view in axial section of an apertured mask cathode-ray tube.

FIG. 1 illustrates a rectangular color picture tube 18 having an evacuated glass envelope 20 comprising a rectangular panel 22 and a tubular neck 24 joined by a funnel 26. The panel 22 comprises a viewing faceplate 28 and a peripheral flange or sidewall 30 which is sealed to the funnel 26 by a frit material 27. A mosaic three-color cathodoluminescent line screen 32 is located on the inner surface of the faceplate 28. The screen 32 comprises an array of phosphor lines extending substantially parallel to the vertical axis (Y—Y) of the tube. Portions of the screen 32 are covered with a light absorbing material in a manner to be described in detail later. A multiapertured color selection electrode or shadow mask 34 is removably mounted within the panel 22 in predetermined spaced relationship to the screen 32. The mask 34 includes a multiplicity of slit shaped apertures which are aligned in substantially parallel vertical columns. Each column contains a plurality of slits which are vertically separated by web portions in the mask. The web portions in adjacent columns are vertically staggered so that the apertures lie in a common brick pattern when viewed sideways.

An inline electron gun 36 (illustrated schematically) is mounted within the neck 24 to generate and direct three electron beams 38B, 38R and 38G along coplanar convergent paths through the mask 34 to the screen 32.

The tube 18 of FIG. 1 is designed to be used with an external magnetic deflection yoke 40 surrounding the neck 24 and funnel 26 in the vicinity of their junction. When appropriate voltages are applied to the yoke 40, the three beams 38B, 38R and 38G are subjected to vertical and horizontal magnetic fields that cause the beams to scan horizontally and vertically in a rectangular raster over the screen 32. For simplicity, the actual curvature of the paths of the deflected beams in the deflection zone is not shown in FIG. 1. Instead, the beams are schematically shown as having an instantaneous bend at the plane of deflection P—P.

Figure 2:
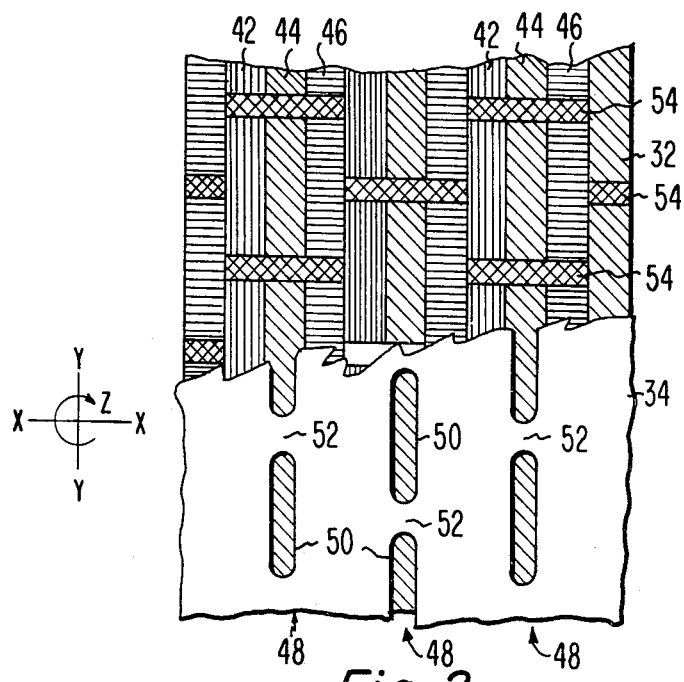
FIG. 2 is a back view of a portion of the screen and mask taken at section line 2—2 of FIG. 1.

A portion of the improved screen 32, partially covered by the mask 34, is illustrated in FIG. 2. The screen 32 comprises alternate, preferably abutting, lines of red, green and blue-emitting phosphor elements 42, 44 and 46, respectively. In the particular embodiment shown, each aperture column 48 is aligned opposite a green phosphor line 44 which is at the center of a three line trio also including red and blue emitting phosphor lines. The mask 34 includes an array of apertures 50, each of which has a width, measured in the X—X direction, which is slightly narrower than the phosphor lines. Therefore, as previously discussed, the tube 18 is a positive tolerance tube in the horizontal or X—X direction since the electron streams passing through the apertures 50 and striking the phosphor lines will be narrower than the phosphor lines.

The apertures 50 in each column 48 are separated from adjacent apertures 50 in the same column by crossties or webs 52 of the mask 34. Because of the presence of these webs 52, portions of each phosphor line in prior art tubes having continuous lines, are shielded from the electron beams 38. In the present tube embodiment, the portions of the screen 32 shielded from the electron beams 38 by the web portions 52 of the mask 34 are covered with patches of a light absorbing material, i.e., graphite. These patches 54, located in alignment with the webs, constitute the only light-absorbing areas of the screen 32. A typical size for each such light absorbing area is approximately 0.2 mm (Y—Y direction) by 1.0 mm (X—X direction) and total screen coverage is about 20 percent. In the foregoing embodiment, the width of the light absorbing areas measured in a direction parallel to the longitudinal dimension of the slits in the mask (Y—Y direction) are substantially equal to the width of the webs measured in the same direction. In other embodiments, the width of the light absorbing areas can be greater than the web width (a negative tolerance condition in the Y—Y direction) or the width of the light absorbing areas can be less than the web width (a positive tolerance condition in the Y—Y direction). The preferred length (in the X—X direction) of the light absorbing areas is equal to the width of three consecutive cathodoluminescent lines of the screen.

In prior art methods of forming a light absorbing matrix on a tube faceplate, a photoresist material is first applied to the faceplate and three separate photoexposures are made using the tube shadow mask as a photomaster. Each exposure establishes the locations where an array of one color emitting phosphor will be deposited by a later process. When completed, the faceplate has a light absorbing matrix thereon with openings in the matrix at the intended locations of the three phosphor arrays.

Unlike the prior art which requires three exposures using three different optical lenses, the light absorbing portion of a screen, as in the preferred embodiment previously described, may be fabricated using only one photoexposure utilizing a single lens. This single exposure may be accomplished by projecting light rays from two or more separated points but, preferably by use of either a line light source positioned perpendicular to the longitudinal dimension of the aperture columns or by a point source moved in a direction perpendicular to the longitudinal dimension of the aperture columns. The length of the line light source or the length of movement of a point light sorce should be sufficient to ensure that the entire intended screen area is exposed except for the areas behind the webs that will be shielded by the webs from the electron beams. Such length, when projected through a mask slit onto the faceplate, should equal the desired width of three consecutive cathodoluminescent lines. Further details on forming the light absorbing portion of a screen may be found in U.S. Pat. No. 3,558,310 issued to E. E. Mayaud on Jan. 26, 1971 and U.S. Pat. No. 3,788,846 issued to E. E. Mayaud et al. on Jan. 29, 1974. These two patents are hereby incorporated by reference for the inclusion herein of such details. In forming the light absorbing portions of the screen, it also may be desirable to form the webs either narrower or wider than the webs in the Y—Y direction. Methods for printing down the size of apertures so that the openings in a light absorbing matrix are smaller than the apertures may be found in the aforementioned U.S. Pat. No. 3,788,846.

Following formation of the light absorbing portion of the screen, the cathodoluminescent lines may be formed in several ways. For example, the lines may be continuous, overlapping the backside of the light absorbing areas, or they may be intermittent so as not to overlap the light absorbing areas. Continuous lines are formed either with a linear light source positioned parallel with the longitudinal dimension of the mask slits or with a point light source or short linear source moved parallel to the longitudinal dimension of the slits. Interrupted lines may be formed by use of either a stationary point light source or by a stationary linear light source too short to have light rays abut behind the webs. A method of forming continuous lines is disclosed in U.S. Pat. No. 4,049,451 issued to H. B. Law on Sept. 20, 1977 which patent is hereby incorporated by reference for the purpose of including such description herein.

Prior art positive tolerance tubes without light absorbing materials on the screen must utilize a faceplate glass of relatively low transmission in order to attenuate ambient light striking the faceplate which reflects back from the phosphors. Because of the addition of the light absorbing materials to the screen of the preferred embodiment, glass with a transmission of about 85 percent can be used for the faceplate, such as is used in many prior art matrix screens.

Improved manufacturing technology has enabled a reduction in the tolerances that need be allowed in electron beam registration with the phosphor elements. By utilizing an embodiment of the present invention, it is possible to take full advantage of this improved technology by using the positive tolerance concept in the horizontal or X—X direction. This is possible because the light absorbing areas are aligned with the webs and will, in most embodiments, intercept only a very small percentage of the electron beams. Therefore, the light absorbing areas of the present invention will have negligible affect on potential light output which may be achieved by increased manufacturing accuracies.

The preferred embodiment also has several advantages over a line-screen, slit mask type tube which has light absorbing areas between each phosphor line. First, because of the relatively large size of the light absorbing areas in the preferred embodiment compared to the thin matrix lines in the prior art tubes, the size of the light absorbing areas are easier to control during screen formation, thereby improving screen quality while reducing scrape rate. In the preferred embodiment, mask mottle, which is reproduced on the screens of prior art matrix tubes, is not reproduced. Mottle is a noticeable irregular pattern on the screen caused by nonuniformity of slit width. Also, the appearance of the screen of a tube constructed in accordance with the preferred embodiment when it is not excited to luminescence is more uniform than many prior art matrix tubes. Such improvement occurs because the center-to-edge grading which shows up in some prior art matrix tube screens is more clearly defined visually by the matrix whereas no such visual definition is present in the preferred embodiment.

It should be noted that although the light absorbing areas of the preferred embodiment are independent of horizontal tube tolerances, light output will be sensitive to vertical errors. For example, if the vertical dimension of a light absorbing patch just equals the expected projection of a web onto the screen, any vertical misregistration of an electron beam will cause a portion of the beam to land on the light absorbing area thereby slightly reducing light output. Therefore, to compensate for such vertical tolerances, and to maintain uniformity, it is preferred to form the patches with either a greater or lesser vertical dimension than the web projections.

I claim:

1. In a photo method of making light absorbing areas of a color picture tube screen wherein the tube includes a cathodoluminescent line screen and a slit aperture mask wherein the slits are arranged in columns and the slits in each column are separated by web portions of the mask, the improvement comprising photoexposing a photosensitive material on a faceplate of a tube utilizing the mask as a photomaster, with light projected from at least two separated points, a straight line connecting the points being perpendicular to the longitudinal dimension of the slits in the mask whereby the said screen is provided with said light absorbing areas consisting of patches in alignment with the said web portions of the mask.

2. The method as defined in claim 1 wherein the two separate points are defined by the ends of a linear light source.

3. The method as defined in claim 1 wherein the photoexposing is from a point source which is moved between the separated points.

4. The method as defined in claim 1 wherein the separated points are a sufficient distance apart to project light rays through a mask slit to strike the photosensitive material a distance apart which is equal to the desired width of three consecutive cathodoluminescent lines.

5. The method as defined in claim 1 wherein light is projected from at least two separated points simultaneously.

6. The method as defined in claim 1 including forming the cathodoluminescent lines of the screen by photoexposing with a point light source.

7. The method as defined in claim 1 including forming the cathodoluminescent lines of the screen by photoexposing with a linear light source having the longitudinal dimension thereof parallel to the longitudinal dimension of the slits in the mask.

8. The method as defined in claim 7 wherein the length of the linear light source is sufficient to permit light rays from the ends of the light source to abut behind a web, thereby continuous cathodoluminescent lines are formed.

9. The method as defined in claim 7 wherein the length of the linear light source is such that light rays from the ends of the light source do not abut behind a web, thereby interrupted cathodoluminescent lines are formed.

* * * * *